United States Patent
Pinchback et al.

(10) Patent No.: US 6,271,715 B1
(45) Date of Patent: *Aug. 7, 2001

(54) BOOSTING CIRCUIT WITH SUPPLY-DEPENDENT GAIN

(75) Inventors: Mark A. Pinchback, Sunnyvale, CA (US); Charles D. Thompson, Buda, TX (US)

(73) Assignee: Maxim Integrated Products, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/032,891

(22) Filed: Feb. 27, 1998

(51) Int. Cl.$^7$ ........................................ G05F 1/10
(52) U.S. Cl. ............................. 327/536; 327/539
(58) Field of Search ...................... 327/390, 143, 327/560, 536, 589, 539; 363/60

(56) References Cited

U.S. PATENT DOCUMENTS

| 4,583,157 | 4/1986 | Kirsch et al. ........................... 363/60 |
| 5,463,542 | 10/1995 | Okamoto ................................ 363/60 |
| 5,889,709 | * 3/1999 | Fukuda ................................. 327/143 |
| 6,023,187 | * 2/2000 | Camacho et al. .................... 327/536 |

FOREIGN PATENT DOCUMENTS

| 0 363 715 | 4/1990 | (EP) . |
| 0 594 305 | 4/1994 | (EP) . |
| 0 661 795 | 7/1995 | (EP) . |
| 0 698 840 | 2/1996 | (EP) . |
| 0 808 014 | 11/1997 | (EP) . |
| 0 836 129 | 4/1998 | (EP) . |

OTHER PUBLICATIONS

"A 10 b, 20 Msample/s, 35 mW Pipeline A/D Converter", Thomas Byunghak Cho et al., IEEE Journal of Solid–State Circuits, vol. 30, No. 3, Mar. 1995.

"A 1.8V, 5.4mW, Digital–Audio EΔ Modulator in 1.2$\mu$m CMOS", Shahriar Rabii et al., IEEE Int'l Solid–State Circuits Conf., Session 14, Paper FP 14.2, Feb. 1996.

"A 1.8-V Digital–Audio Sigma–Delta Modulator in 0.8-$\mu$m CMOS", Shahriar Rabii et al., IEEE Journal of Solid–State Circuits, vol. 32, No. 6, Jun. 1997.

* cited by examiner

*Primary Examiner*—Jung Ho Kim
(74) *Attorney, Agent, or Firm*—Blakely, Sokoloff, Taylor & Zafman LLP

(57) ABSTRACT

The present invention comprises a method and apparatus for boosting an input signal to an output signal with a variable gain according to a supply voltage. The circuit comprises a detector and a voltage booster. The detector detects the supply voltage and generates a control signal having a value dependent on a difference between the detected supply voltage and a critical supply voltage. The critical supply voltage is temperature insensitive. The voltage booster is coupled to the detector for generating an output signal having a gain relative to the input signal. The gain is dependent on the value of the control signal.

12 Claims, 4 Drawing Sheets

BOOSTING CIRCUIT WITH SUPPLY-DEPENDENT GAIN

BACKGROUND OF THE INVENTION

1. Field of the Invention

The present invention relates to analog integrated circuits. In particular, the present invention relates to voltage booster circuits such as are used in data converters.

2. Description of Related Art

Integrated switched-capacitor filter circuits, such as those used in the analog modulator of Delta-Sigma analog-to-digital converters (ADCs), use metal-oxide-semiconductor (MOS) transistors as switches to perform sampling tasks and to achieve the transfer of charge between the various capacitors within the filter. The switches profoundly affect circuit performance.

The switch's; on-resistance is a function of the MOS gate to source potential difference. When used at low power supply voltages, it becomes difficult to turn the switch on—since the limited supply voltage makes it difficult to increase the gate-to-source potential above the threshold voltage of the MOS device. Small switches exhibit a high on resistance. This results in reduced circuit bandwidth and limits the maximum usable sample rate. This is particularly undesirable in Delta-Sigma ADCs, where over-sampling at a high ratio (100 or more) is common. However, small switches do give best DC performance—a result of low charge injection errors from the small channel and stray capacitances. Larger switches can improve the circuit bandwidth and allow faster sampling rates. However, the accompanying increase in charge injection from using larger switches results in higher offsets and higher offset drift errors for the ADC, which are critical issues in high resolution converters.

A common technique to improve the performance of switched capacitor circuits under low-voltage operation is to use a voltage boosting circuit on the sampling clock signals to increase the available gate drive voltage to the NMOS switch transistors. This can dramatically reduce the switch on resistance, increasing the maximum sample rate without a corresponding increase in the switch size and a reduction of the DC performance. However, the boosted circuit may no longer be able to operate at high supply voltages for the following reason. If used at a high supply voltage, the boosted gate voltage can be so high that it stresses the switch and driver devices and results in reduced reliability—even catastrophic failure. As a result, existing designs are either targeted at high or at low supply voltage operation and optimized accordingly. This limits the applicability of a particular data converter design to a narrow range of possible power supply voltages.

Therefore, it is desirable to have a method and apparatus to provide a voltage boosting circuit which can be automatically reconfigured according to the power supply voltage.

SUMMARY OF THE INVENTION

The present invention comprises a method and apparatus for boosting an input signal to an output signal with a variable gain according to a supply voltage. The circuit comprises a detector and a voltage booster. The detector detects the supply voltage and generates a control signal having a value dependent on a difference between the detected supply voltage and a critical supply voltage. The voltage booster is coupled to the detector for generating an output signal having a gain relative to the input signal. The gain is dependent on the value of the control signal.

BRIEF DESCRIPTION OF THE DRAWINGS

The objects, features and advantages of the present invention will become apparent from the following detailed description of the present invention in which.

DESCRIPTION OF THE PRESENT INVENTION

Figure 1:
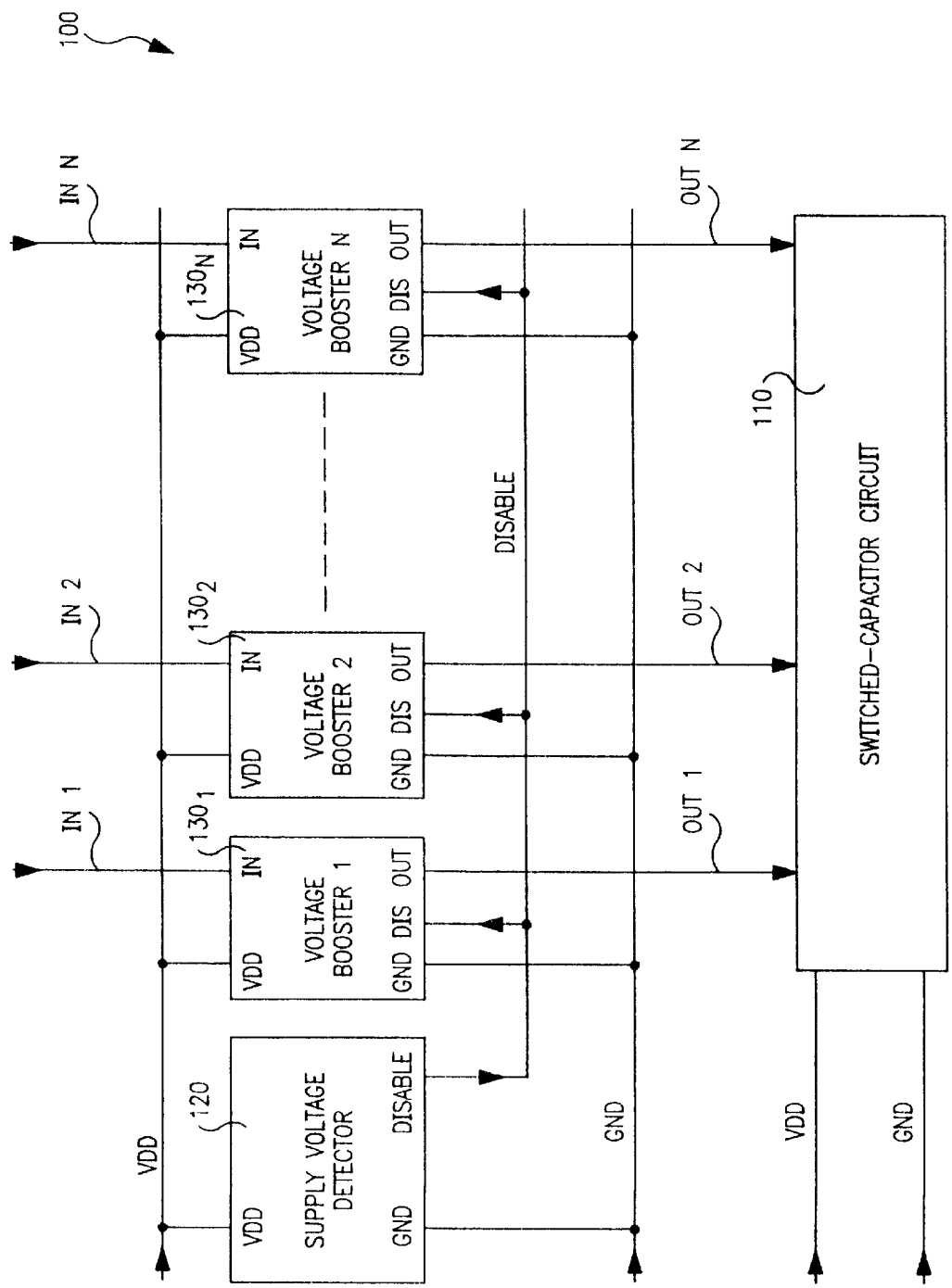
FIG. 1 is a block diagram of one embodiment of a data converter subsystem using voltage boosters in accordance with the teachings of the present invention.

The present invention discloses a method and apparatus for boosting the voltage level of a sampling switch control signal in a data converter using switched-capacitor sampling technique. The circuit comprises a supply detector and at least one voltage booster. The supply detector detects the supply voltage level and generates a control signal according to the detected supply voltage. The voltage booster has a variable boosting gain as a function of the supply voltage level.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention.

The circuit of the preferred embodiment of the present invention is used to provide the sampling clock waveforms to control the critical sampling switches in the switched capacitor filter for a sigma-delta modulator of a high resolution analog-to-digital converter (ADC).

The present invention provides the ability to use a single design at both high and low supply voltages. By use of the boosted clock voltages, the degradation in performance which would normally occur at low supply voltages is avoided. Conversely, at high supply voltages, the voltage detector reduces the boost factor, removing the potential hazards of excessively high voltage excursions.

The present invention is preferably used in low power, high resolution (e.g., 16-bit), sigma-delta ADCs. As a result, these devices offer excellent high speed operation with good DC drift specifications, for supplies down to 2.7V, yet still allow operation of the part over the traditional 4.75 to 5.25V supply range.

The present invention comprises the novel use of a supply voltage detector in conjunction with a charge pump based voltage-boosting circuit having a switchable gain. The combination allows the available gate drive voltage to the critical NMOS switches to be controlled such that it may be boosted significantly above the supply, at low supply voltages, and may be slightly boosted or even virtually un-boosted when the circuit is used at high power supply voltages. The advantages of the present invention are:

1. A single electrical design, utilizing only one integrated circuit (IC) mask set, can now be used to provide consistently high performance at both low and at high supply voltages—resulting in increased utility, flexibility, and reduced manufacturing cost.

2. At low supply voltages, the circuit automatically detects that voltage boosting is necessary and enables a high boost factor. The dynamic performance of the circuit is correspondingly enhanced as a result of lower switch impedances.

3. At high supply voltages, the circuit automatically detects that it should operate less boosted or un-boosted. The boost factor is set close to unity and the possibility of reduced reliability from too high a drive to the MOS transistor terminals is removed.

4. DC performance is improved over using large MOS switches. Circuits built using this technique will have better offset and offset drift characteristics - important considerations in high resolution Analog-to-Digital conversion.

This supply-dependent, boosted gate drive circuit is used to drive the critical sampling switches within the switched-capacitor analog modulator.

Referring to FIG. 1, a diagram illustrating one embodiment of a data converter subsystem 100 using voltage boosters in accordance with the teachings of the present invention is shown. The data converter subsystem 100 comprises a switched-capacitor circuit 110, a supply voltage detector 120, and N voltage boosters $130_1$ through $130_N$. As is well known by one skilled in the art, there may be as few as one (i.e., N=1) voltage booster in the subsystem 100.

The switched-capacitor circuit 110, the supply voltage detector 120 and the voltage boosters $130_1$ through $130_N$ receive VDD as the power supply voltage and GND as the ground potential.

The supply voltage detector 120 generates a control signal, the DISABLE signal, based on a detection of the supply voltage. The DISABLE signal is connected to the voltage boosters $130_1$ through $130_N$. The voltage boosters $130_1$ through $130_N$ receive the input signals IN 1 through IN N and generate N output signals OUT 1 through OUT N, respectively, at a boost gain controlled by the DISABLE signal.

Each booster circuit $130_1$ through $130_N$ has two boost settings. In the preferred embodiment, the first setting has a boost factor of close to 1. This means that the circuit acts merely as a buffer circuit with approximately unity gain. The booster operates in this mode when its DISABLE input is held at a logic "1". The second boost factor is greater than one and may be chosen as a ratio of capacitors—one being the load capacitor that the booster circuit is required to drive. The booster circuit operates in this mode when the DISABLE input is driven at a logic "0".

Detection of Supply Voltage.

Figure 2:
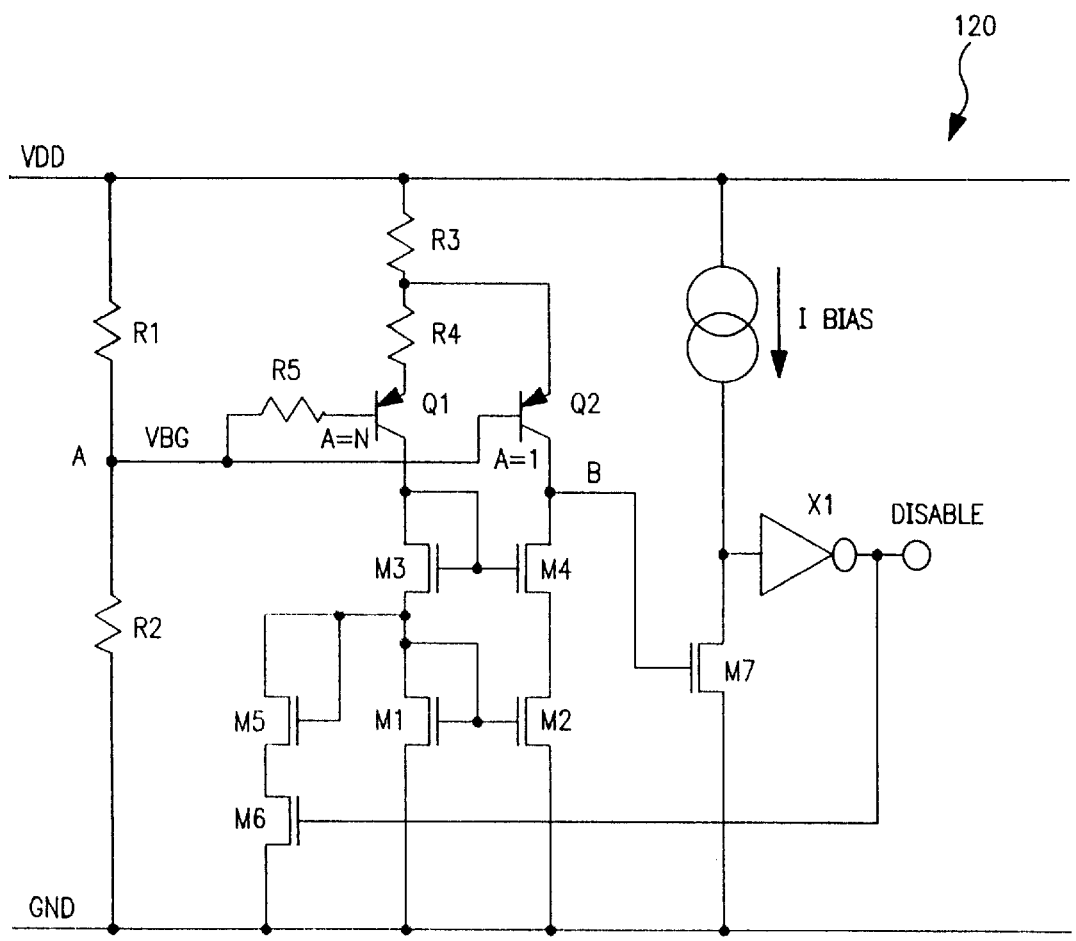
FIG. 2 is a circuit diagram of one embodiment of a supply voltage detector that operates in accordance with the teachings of the present invention.

Referring to FIG. 2, a diagram illustrating one embodiment of a supply voltage detector 120 that operates in accordance with the teachings of the present invention is shown.

The supply voltage detector 120 connects between the device's power supply and ground terminals. It generates the DISABLE control signal by comparing the power supply voltage with a predetermined critical supply voltage. When the power supply voltage is below the critical supply voltage, the DISABLE output is driven to logic "0". When the power supply voltage is above the critical supply voltage, the DISABLE output is driven to logic "1". As is known by one skilled in the art, the logic levels of the DISABLE control signal may be reversed with appropriate changes in the corresponding voltage booster.

The voltage ranges of the low voltage operating supply and the high voltage operating supply are non overlapping voltage ranges. Thus the transition voltage (the critical supply voltage) between the DISABLE=0 and DISABLE=1 states is preferably set above the maximum possible low voltage operating supply voltage and below the minimum possible high voltage operating supply voltage. A small amount of hysteresis is provided to avoid the situation that the DISABLE control signal oscillates between these two states when the power supply is slowly ramped up or down.

The supply voltage detector 120 comprises two bipolar transistors Q1 and Q2, resistors R3 and R4, a voltage divider formed by resistors R1 and R2 connected across the supply and ground terminals, a current source BIAS, an inverter X1, and n-channel transistors M1, M2, M3, M4, M5, M6, and M7. Supply voltage detection is achieved by comparing a fraction of the supply voltage against a band-gap voltage as explained below.

In the circuit of FIG. 2, n-channel transistors M1 and M2 are of the same size, whereas bipolar transistor Q1 has N times the area of bipolar transistor Q2. In another embodiment, the bipolar transistor Q1 is implemented as N bipolar transistors, connected in parallel, each having the same area as the bipolar transistor Q2. As is known by one skilled in the art, M1 and M2 may be of different sizes.

Assume for the moment that n-channel transistor M6 is off, and that node B is neither charging nor discharging. Also for the moment, neglect the base currents of the bipolar transistors Q1 and Q2. Since n-channel transistors M1 and M2 are connected as a current mirror, the current through resistor R4, transistor Q1 and diode-connected transistor M3 will be mirrored by transistor M1 to transistor M2. Accordingly, because node B is not charging or discharging, the current through bipolar transistor Q2 (and through n-channel transistor M4) will equal the current through bipolar transistor Q1, independent of temperature. Since bipolar transistor base currents are at least initially assumed to be zero, the voltage across resistor R5 may initially be assumed to be zero. With this assumption, the base voltages of transistors Q1 and Q2 are equal, so that the voltage across resistor R4 is equal to the $V_{BE}$ of transistor Q2 minus the $V_{BE}$ of transistor Q1.

The base-emitter voltage $V_{BE}$ of a junction transistor is given by the following equation:

$$V_{BE} = V_{BG}\left(1 - \frac{T}{T_0}\right) + V_{BE0}\left(\frac{T}{T_0}\right) + \frac{nKT}{q}\ln\left(\frac{T_0}{T}\right) + \frac{mKT}{q}\ln\left(\frac{I_C}{I_{C0}}\right)$$

where:

T=temperature $T_0$=an arbitrary reference or starting temperature $I_C$ the transistor collector current $I_{C0}$=collector current for which $V_{BE0}$ was determined $V_{BG}$=semiconductor bandgap voltage extrapolated to a temperature of absolute zero $V_{BE0}$=base to emitter voltage V at $T_0$ and $I_{C0}$ q=electron charge n=structure factor m=ideality factor, m is close to 1 in practical circuits.
K=Boltzmann's constant
The dominant terms are the first two terms:

$$V_{BG}\left(1 - \frac{T}{T_0}\right) + V_{BE0}\left(\frac{T}{T_0}\right) = V_{BG} - (V_{BG} - V_{BE0})\left(\frac{T}{T_0}\right)$$

and since $V_{BG}$ is larger than $V_{BE0}$, the net result is a negative temperature coefficient for the $V_{BE}$ of a transistor.

If one subtracts the $V_{BE}$s of two identical transistors $Q_1$ and $Q_2$ operating with different collector currents, there results:

$$V_{BE1} - V_{BE2} = \frac{KT}{q}\ln\left(\frac{I_{C1}}{I_{C0}}\right) - \frac{KT}{q}\ln\left(\frac{I_{C2}}{I_{C0}}\right) \quad \text{or:}$$

$$V_{BE1} - V_{BE2} = \frac{KT}{q}\ln\left(\frac{I_{C1}}{I_{C2}}\right)$$

This frequently is expressed in terms of current densities $J_1$ and $J_2$ in the two transistors as follows:

$$V_{BE1} - V_{BE2} = \frac{KT}{q}\ln\left(\frac{J_1}{J_2}\right)$$

or for two transistors of different areas A operating with identical collector currents, can be expressed in terms of the transistor areas A as follows:

$$V_{BE1} - V_{BE2} = \frac{KT}{q}\ln\left(\frac{A_2}{A_1}\right)$$

Thus, the current I4 through resistor R4 is proportional to absolute temperature. Since it was assumed that node B is neither charging or discharging so that the current through bipolar transistor Q2 is equal to the current mirrored to transistor M2, the voltage at node A must equal VDD minus the voltage drop across resistor R3 minus the $V_{BE}$ Of transistor Q2. Consequently, under the assumed condition, since the current in transistors Q1 and Q2 are equal under these conditions, the current through resistor R3 will also be proportional to absolute temperature, namely twice the current through resistor R4. By proper matching of the resistor values, the increasing voltage drop across resistor R3 proportional to absolute temperature may be made to offset the decrease in the base to emitter voltage $V_{BE}$ of transistor Q2 with temperature. In this way, the voltage required at node A for the currents in M2 and Q2 to match and for the detector to be at the point of switching between states will be equal to a bandgap voltage below $V_{DD}$. Furthermore, since the bandgap voltage is independent of temperature, the supply voltage at which the state change occurs will also be virtually independent of temperature and will depend only on the ratio of resistors R1 and R2.

When VDD is lower than the critical supply voltage, the voltage at node A will be less than one bandgap voltage below $V_{DD}$, tending to turn transistor Q2 off more than transistor Q1. Now the current in transistor Q1 as mirrored to transistors M2 and M4 will be greater than in Q2, so that the gate of transistor M7 will be driven low, turning off transistor M7. The current source I BIAS provides sufficient current to pull the input of the inverter X1 HIGH, causing the DISABLE output to be held low.

When VDD is higher than the desired critical supply voltage, the reverse happens, so that more current flows through transistor Q2 than is mirrored from transistor Q1 to transistors M2 and M4. Now node B rapidly charges, turning on transistor M7, pulling the input of the inverter X1 to ground and causing the DISABLE output to go high.

The DISABLE output signal is connected to the gate of transistor M6 and thus turns on transistor M6 when the disable signal is HIGH. This couples diode connected transistor M5 in parallel with the mirroring transistor M1, effectively increasing the conductance thereof so that the current in transistor Q1 is now mirrored to transistors M2 and M4 with less than a 1 to 1 relationship. This provides a small amount of positive feedback to produce hysteresis in the transfer function dependent on the relative size of transistors M1 and M5.

Consider the case as the supply voltages rise. At the critical DISABLE switching voltage, the ratio of R1 to R2 is chosen from:

$$R1 = R2 * (V_{BG}/(V_{DIS} - V_{BG})) \tag{1}$$

where:
  $V_{BG}$ is the band-gap voltage for the process (approx. 1.23V)
  $V_{DIS}$ is the required switching voltage for the DISABLE signal Resistor R5 provides compensation for the base current drawn through the potential divider which would otherwise degrade temperature stability of the switching point due to the base current proportional to absolute temperature drawn by Q1 and Q2. To compensate, the resistors are chosen so that for the case where the currents in Q1 and Q2 are the same:

$$R5 = (R4/R3)*(R1*R2)/(R1+R2) \tag{2}$$

Transistor M6 will not affect the rising critical supply voltage since transistor M6 is turned off because the DISABLE signal is low. It will, however, reduce the supply voltage at which DISABLE returns low. Transistor M6 may be sized to provide the minimum desired hysteresis, while ensuring that the DISABLE control signal is always low over the entire "Low Voltage" operating range.

Voltage Booster Circuit.

Figure 3:
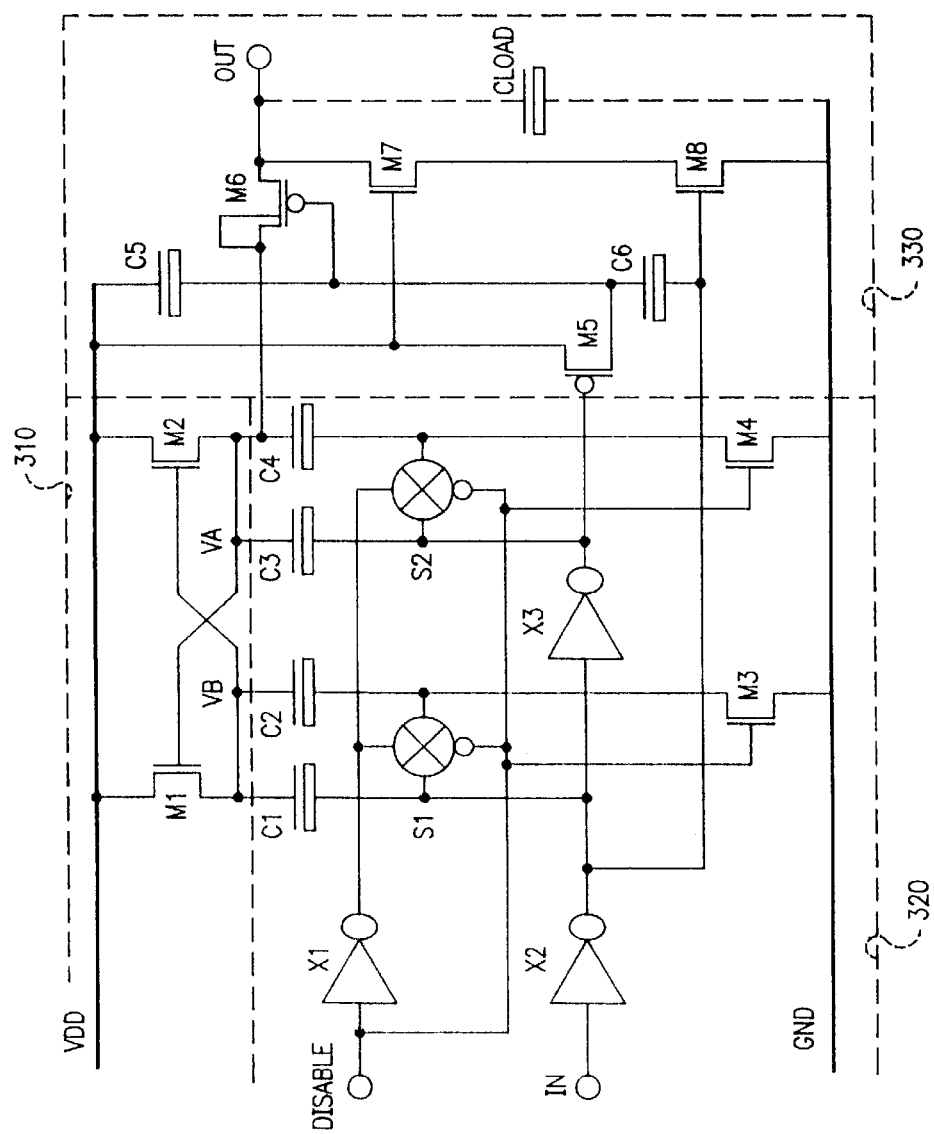
FIG. 3 is a diagram of one embodiment of a voltage booster that operates in accordance with the teachings of the present invention.

Referring to FIG. 3, a diagram illustrating one embodiment of a voltage booster 130 that operates in accordance with the teachings of the present invention is shown. The voltage booster 130 is used on each of the sampling clock signals to the switched-capacitor circuit 110 shown in FIG. 1. The voltage booster 130 uses a capacitor-based charge pump technique. The voltage booster 130 receives the IN input signal having a voltage VIN, the DISABLE control signal, and the supply voltages VDD and GND. The voltage booster 130 generates an OUT output signal having a voltage VOUT. The voltage booster 130 comprises a driver circuit 310, a switchable charging circuit 320, and an output circuit 330.

The driver circuit 310 is used to reduce the temperature drift in the sampled circuit. This is achieved by ensuring that the boosted output voltage at the OUT output signal does not contain a term which depends on the threshold voltages of either the NMOS or PMOS transistors. The driver circuit 310 uses a cross-coupled driver stage around NMOS transistors M1 and M2.

The switchable charging circuit 320 is used to provide switchable charging paths to the output signal OUT. The switchable charging circuit 320 comprises capacitors C1, C2, C3 and C4, switches S1 and S2, inverter gates X1, x2, and x3, and two NMOS transistors M3 and M4.

The capacitors C3 and C4 are used in conjunction with the load capacitor CLOAD to provide the boost gain to the OUT output voltage. Transistor M6 provides the charging path for the output load capacitance. The available charge for the load is sampled on to either C3, or C3 and C4 depending on the state of the DISABLE control signal as explained later. A variable gain for the boosted voltage is realized via the change in the charge for the load, from C3 alone to C3 and C4. The switching between the two charging paths is performed by the switches S1 and S2.

Switches S1 and S2 are controlled by two complementary control signals, in this case, the complementary signals of the DISABLE signal. Switch S2 and NMOS Transistor M4 change the connection of C4 between enabled and disabled modes. This changes the gain of the boosted output. Switch S1 and NMOS Transistor M3 provide the same action for C2 which changes the boost at node VB. This is required to prevent excessive voltage within the booster itself, when used at high supply voltages.

When the DISABLE signal is LOW, switches S1 and S2 are turned ON, at the same time NMOS transistors M3 and M4 are OFF. In this configuration, C1 and C2 are connected in parallel with respect to node VB, and C3 and C4 are connected in parallel with respect to node VA.

When the DISABLE signal is HIGH, switches S1 and S2 are turned OFF, at the same time NMOS transistors M3 and M4 are ON, providing the connection to ground for C2 and C4, respectively. In this configuration, C1 and C2 are separated with C2 being connected to ground via NMOS transistor M3, and C3 and C4 are separated, with C4 being connected to ground via NMOS transistor M4.

Capacitors C1 and C2 provide a boosted drive voltage (VB) for M2. This is used to turn on transistor M2 in order to charge C3 and C4 all the way to the supply rail—removing any threshold voltage component from the boost gain function. C1 and C2 can be small compared to C3 and C4. C1 and C2 are chosen to give a boosted voltage at VB sufficient to turn on M2 and complete the charging of C3 in the available clock period.

Capacitances associated with transistors M1, M2, M6 and M7 and stray capacitances at VA are negligible and can be ignored. When the DISABLE control signal is at a logic "0" and when IN input signal is HIGH, the voltage at the OUT output signal is:

$$VOUT=VDD*[2*(C3+C4)/(CLOAD+C3+C4)] \quad (3)$$

When the DISABLE control signal is at a logic "1" and when IN input signal is HIGH, the voltage at the OUT output signal is:

$$VOUT=VDD*[(2*C3+C4)/(CLOAD+C3+C4)] \quad (4)$$

Knowing the expected CLOAD and choosing appropriate values for C3 and C4, the level of boost in each mode can be adjusted. The maximum achievable boost approaches 2*VDD as C3 and C4 are made large compared to the CLOAD.

The output circuit 330 provides the OUT output signal as a function of the IN input signal and the DISABLE control signal. The output circuit 330 comprises a charging transistor M6, three steering transistors M5, M7 and M8, and two capacitors C5 and C6. The IN input signal is the clocking signal that provides the gating of the supply signal VDD to the OUT output signal. When IN is LOW, NMOS transistor M8 is ON, pulling OUT to ground via M7 and M8. When IN is HIGH, NMOS transistor M8 and PMOS transistor M5 are OFF, the OUT output signal is then driven to HIGH voltage according to the capacitive gain provided by the capacitors C3, C4 and CLOAD with respect to the supply voltage VDD.

Capacitor C5 and C6 are small capacitors. They form a capacitive potential divider to reduce the voltage on the gate of transistor M6 so that the PMOS output device turns hard on as VA rises above the supply. When C3 is charging, transistor M6 is turned off by transistor M5 which pulls the gate of transistor M6 to the supply rail.

Figure 4:
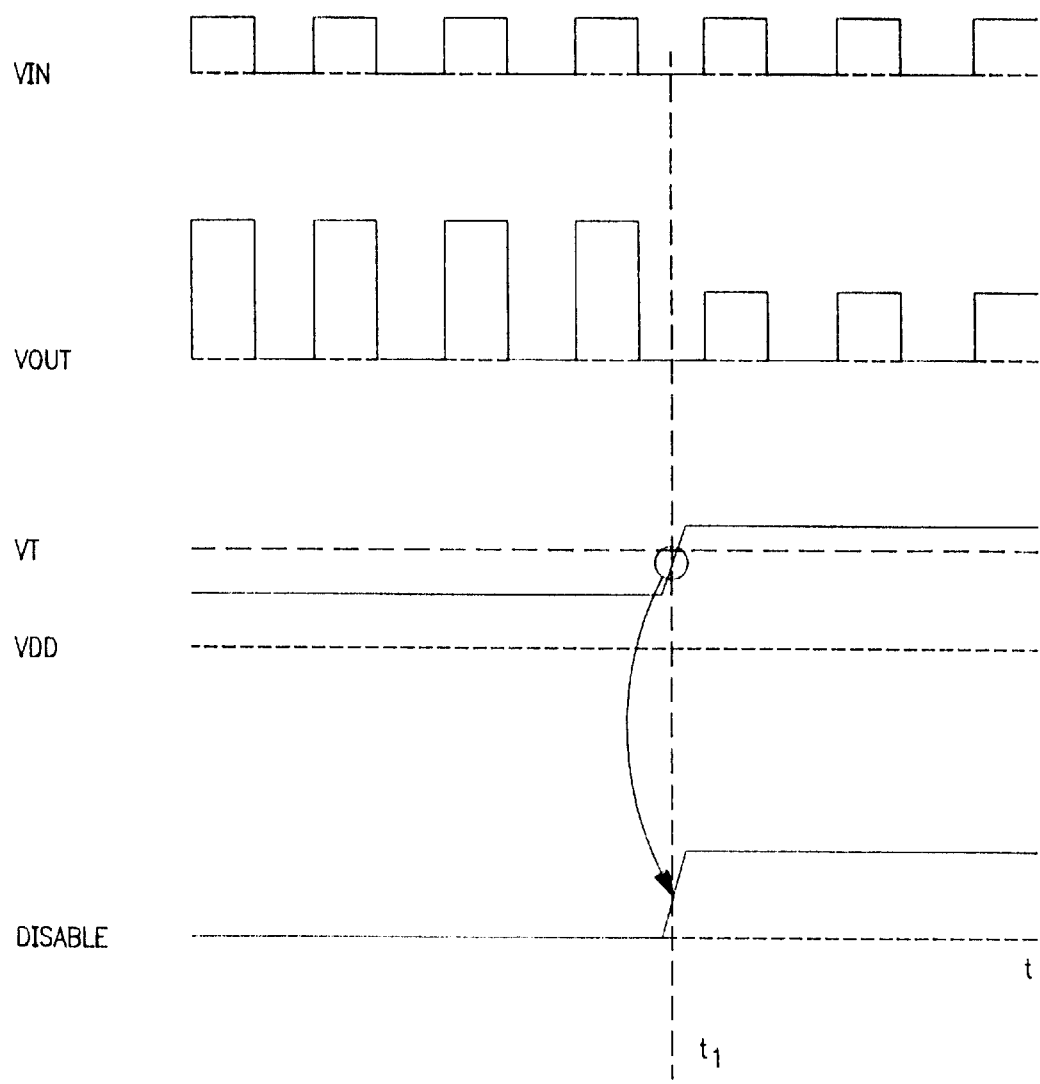
FIG. 4 is a timing diagram illustrating the timing relationship between the output signal and the input signal according to the supply voltage level.

Now referring to FIG. 4, a timing diagram illustrating the generation of the OUT signal of the voltage booster 130 is shown. The timing diagram shows the timing relationship between the signals VOUT, VIN, VDD and DISABLE.

The VIN signal is a clock signal at constant amplitude. When VDD is below the critical supply voltage VT, the DISABLE signal is LOW, the VOUT is boosted by the capacitive gain. At t=t1, the VDD is above the critical supply voltage VT, the DISABLE signal is HIGH, switching the booster gain to close to unity, so that VOUT is driven to close to VIN.

The present invention discloses a method and apparatus for providing supply-dependent boosted voltages in a data converter. The circuit utilizes a supply detector and at least one voltage booster. The supply detector detects the supply voltage level and generates a disable signal according to the detected supply voltage. The voltage booster has a variable boosting gain as a function of the disable signal. The present invention provides design flexibility, good transient and DC performance, and reduced manufacturing costs While the invention has been described with reference to an illustrative embodiment, this description is not intended to be construed in a limiting sense. Various modifications of the illustrative embodiment, as well as other embodiments of the invention, which are apparent to persons skilled in the art to which the invention pertains, are deemed to lie within the spirit and scope of the invention.

What is claimed is:

1. A circuit operating across a power supply terminal and a ground terminal, the circuit comprising:
   a detector for detecting a supply voltage at the power supply terminal, the detector generating a control signal having a value dependent on a difference between the detected supply voltage and a critical supply voltage, the detector comprising a band-gap comparator based on a band-gap reference voltage to control the critical supply voltage to be substantially independent of temperature; and
   a voltage booster coupled to the detector for boosting an input signal to an output signal at a gain determined by the value of the control signal.

2. The circuit of claim 1 further comprises a switched-capacitor circuit coupled to the voltage booster for switching a sampling circuit using the boosted output signal.

3. The circuit of claim 2 wherein the circuit is used in a delta-sigma analog-to-digital converter.

4. The circuit in claim 1 wherein the gain is larger than unity when the detected supply voltage is below the critical supply voltage and is approximately equal to unity when the detected supply voltage is above the critical supply voltage.

5. The circuit in claim 1 wherein the detector further comprises:
   a first voltage divider connected between the power supply terminal and the ground terminal for providing a divider voltage at a divider node, the divider voltage being variable according to the supply voltage;
   a first and second bipolar transistors coupled to the divider node and to the power supply terminal via a second voltage divider, the first and second bipolar transistors forming the band-gap comparator and operative between the power supply terminal and the divider node and responsive to the critical supply voltage, the band-gap comparator controlling a first and second currents through the first and second bipolar transistors, respectively, according to the divider voltage; and a third transistor coupled to the second bipolar transistor for varying the value of the control signal according to a difference between the first and second currents.

6. The circuit of claim 1 wherein the voltage booster further comprises:

a driver coupled to receive the supply voltage;

a charging circuit coupled to the driver for switching a charging path to the output signal in response to the control signal to vary the gain; and an output circuit coupled to the driver and the charging circuit for generating the output signal at the gain varied by the charging circuit.

7. A method of boosting an input signal to an output signal at a gain responsive to a supply voltage, the method comprising:

detecting the supply voltage based on a critical supply voltage, the detecting including forming a band-gap comparator based on a band-gap reference voltage to control the critical supply voltage to be substantially independent of temperature;

generating a control signal having a value dependent on a difference between the detected supply voltage and the critical supply voltage; and generating the output signal at a gain relative to the input signal according to the value of the control signal.

8. The method of claim 7 wherein detecting includes:

providing a divider voltage by a voltage divider;

varying the divider voltage according to the supply voltage;

responding to the critical supply voltage via first and second bipolar transistors; and controlling a first and second currents through the first and second bipolar transistors, respectively, according to the divider voltage.

9. The method of claim 8 wherein generating the control signal includes:

varying the value of the control signal according to a difference between the first and second currents which is representative of the difference between the supply voltage and the critical supply voltage.

10. The method of claim 7 wherein generating the output signal comprises:

providing a first and second capacitors having a first and second capacitances, respectively; and switching a charging path through the first and second capacitors to the output signal in response to the control signal so that the gain is varied as a function of the first and second capacitances.

11. The method of claim 10 wherein switching the charging path comprises connecting the first and second capacitors when the control signal is at a first state and disconnecting the first and second capacitors when the control signal is at a second state.

12. The method of claim 11 wherein the gain is larger than unity when the control signal is at the first state and the gain is approximately equal to unity when the control signal is at the second state.

* * * * *